United States Patent [19]

Chu et al.

[11] Patent Number: 5,245,206
[45] Date of Patent: Sep. 14, 1993

[54] CAPACITORS WITH ROUGHENED SINGLE CRYSTAL PLATES

[75] Inventors: Jack O. Chu, Long Island City; Louis L. Hsu, New York, both of N.Y.; Toshio Mii, Essex Junction, Vt.; Joseph F. Shepard, Hopewell Junction, N.Y.; Scott R. Stiffler, Brooklyn, N.Y.; Manu J. Tejwani, Yorktown Heights, N.Y.; Edward J. Vishnesky, Poughkeepsie, N.Y.

[73] Assignee: International Business Machines Corporation, Armonk, N.Y.

[21] Appl. No.: 881,944

[22] Filed: May 12, 1992

[51] Int. Cl.$^5$ .................. H01L 29/68; H01L 29/78; H01L 29/92
[52] U.S. Cl. .................. 257/309; 257/301; 257/190; 257/68
[58] Field of Search .................. 357/23.6; 361/313; 257/309, 301, 190, 68

[56] References Cited

U.S. PATENT DOCUMENTS

| | | | |
|---|---|---|---|
| 4,397,075 | 8/1983 | Fatula, Jr. | 29/571 |
| 4,717,689 | 1/1988 | Maas et al. | 437/225 |
| 4,906,590 | 3/1990 | Kanetaki et al. | 437/52 |
| 5,130,885 | 7/1992 | Fazan et al. | 361/313 |
| 5,191,509 | 3/1993 | Wen | 257/309 |

FOREIGN PATENT DOCUMENTS 1-278060 11/1989 Japan.
1-283860 11/1989 Japan.

OTHER PUBLICATIONS

J. C. Bean, et al., "Ge$_x$Si$_{1-x}$/Si Strained-Layer Superlattice Grown by Molecular Beam Epitaxy" J. Vac. Sci, Technol. A2 (2) pp. 436-440 (Apr.-Jun. 1984).

J. Murota, et al., "Low-Temperature Silicon Selective Deposition & Epitaxy on Silicon Using the Thermal Decomposition of Siland Under Ultraclean Environment" Appl. Phys. Lett. 54, pp. 1007-1009 (Mar. 13, 1989).

Y. Hayashide, et al., "Fabrication of Storage Capacitance-Enhanced Capacitors with a Rough Electrode" Extended Abstracts of the 22nd International Conference on Solid State Devices & Materials, pp. 869-872 (Nov. 1990).

H. Watanabe, et al., "A New Stacked Capacitor Structure Using Hemispherical-Grain (HSG) Poly-Silicon Electrodes" pp. 873-876 Extended Abstracts of the 22nd International Conference on Solid State Devices & Materials (Nov. 1990).

W. J. Varhue, et al., "Surface Morphology of Epitaxial Ge on Si Grown by Plasma Enhanced Chemical Vapor Deposition" pp. 26-28 (Oct. 1990).

*Primary Examiner*—Rolf Hille
*Assistant Examiner*—Robert Limanek
*Attorney, Agent, or Firm*—Jeffrey L. Brandt; Harold Huberfeld

[57] ABSTRACT

A capacitor is provided having a substrate and a first capacitor plate including a lattice mismatched crystalline material is formed over and supported by a surface of the substrate. A layer of insulating material is formed over and supported by the first capacitor plate. A second capacitor plate including a layer of conductive material is formed over and supported by the layer of insulating material.

9 Claims, 2 Drawing Sheets

CAPACITORS WITH ROUGHENED SINGLE CRYSTAL PLATES

This invention relates generally to semiconductor device structures and fabrication, and more particularly to capacitors with roughened single crystal plates.

BACKGROUND OF THE INVENTION

As memory cells, and particularly dynamic, random access memory (DRAM) cells, become increasingly smaller, charge storage becomes more difficult. Smaller cells include smaller capacitors, which in turn store less charge. Eventually, circuit noise can overcome the stored charge, making the data from the memory cells unreliable.

Several techniques have been used in the art to increase capacitance and charge storage without affecting, or while minimally affecting, cell size.

One such technique includes the use of trench capacitors, wherein capacitor plates are formed on the walls of trenches extending into the semiconductor substrate. Such trench capacitors use the area on the vertical walls of the trenches to increase the capacitance without increasing the size, or footprint, of the cells on the substrate (see for example, W. P. Noble et al., IEDM 1987, pp. 340–343).

The formation of capacitors on raised mesas can be used to accomplish the same results as trench capacitors (see for example, H. Arima et al., IEDM 1991, pp. 651–654).

Another technique, analogous to that of trench and mesa capacitors, is stacked capacitors. In a stacked capacitor environment, the capacitor plates are stacked over the cells, again increasing capacitance and charge storage with minimal or no increase in footprint. See, for example, JA 0278060 by Fujitsu showing a stacked capacitor structure.

JA 283860 by Mitsubishi Electric Corp. shows the formation of a conical structure within a capacitor trench. The capacitor plates are formed over the cone thereby increasing the area of the plates. This structure can achieve a modest increase in capacitor area (i.e. about 2×), but its reproducability is highly dependent on the etching steps used to form the cone. In addition, in practice, as trench widths become smaller (e.g., less than 0.8 μm), the formation of such cones inside a trench becomes very difficult. Typically the chemical vapor deposition (CVD) of polysilicon (polycrystalline silicon) is a very conformal process and thus is not suitable for forming such cones. Silicon cones may be formed inside a trench by sputtering processes provided the trench is sufficiently wide (e.g., >1.0 μm). For smaller trench widths, the sputtered silicon tends to substantially close the opening at the top of the trench, thus making cone formation difficult or impossible.

U.S. Pat. No. 4,906,590 to Kanetaki et al. shows a method of forming a trench capacitor wherein photoresist deposited within the trench is exposed to a standing wave of light intensity. The exposed photoresist is developed to leave a patterned mask, which is in turn used to etch periodic hollows in the side wall of the trench. A capacitor plate is formed in the trench, the roughened side wall increasing the plate area.

U.S. Pat. No. 4,397,075 to Fatula, Jr. et al. (assigned to the assignee of the present invention) shows a method of forming an FET memory cell wherein a wet etch is used to form a widened well within a trench. The cell capacitor thus has an increased area relative to a capacitor formed within an unmodified trench.

To further address the problem of charge storage in increasingly smaller capacitors, it has been proposed to texture the capacitor plates, whereby to increase the charge storage area. Hayashide, Y., et al., "Fabrication of Storage Capacitance-Enhanced Capacitors with a Rough Electrode," Extended Abstracts of the 22nd Conference on Solid State Devices and Materials, Sendai, 1990, pgs. 869–872, shows a method of forming polysilicon films on substrates wherein highly textured surfaces result. The Hayashide process is performed using low pressure, chemical vapor deposition (LPCVD) at a temperature of 580 degrees centigrade.

Watanabe, H., et al., "A New Stacked Capacitor Structure Using Hemispherical-Grain (HSG) Poly-Silicon Electrodes," Extended Abstracts of the 22nd Conference on Solid State Devices and Materials, Sendai, 1990, pgs. 873–876 shows a 64Mbit DRAM storage cell including roughened polysilicon storage electrodes formed by LPCVD at 600 degrees centigrade.

Hayashide and Watanabe both suffer from the disadvantage of being highly temperature dependent, bringing into question process reproducability.

In summary, while the problem of providing sufficient charge storage for increasingly smaller memory cells has been recognized in the art, the previously known solutions suffer from significant drawbacks. Trench, stacked, and mesa capacitor structures do not provide sufficient capacitor area for the increasingly smaller physical size and higher capacity memory cells. Processes which alter the shape of the trench (i.e. by providing wells or hollows) require significant additional processing to provide relatively small increases in capacitor area. The use of textured surfaces, as currently proposed, requires strict process tolerances which can, in turn, create difficulties in uniformly reproducing capacitor area. For example, the formation of a textured polysilicon surface must generally be accomplished in a narrow temperature range (e.g. 570° C.–590° C.). Thus subsequent process options are limited to lower temperatures, since subsequent higher process temperatures may reduce surface roughness.

OBJECTS OF THE INVENTION

An object of the present invention is to provide a new and improved process for forming capacitors of suitable size without increasing overall device size and retaining compatibility with semiconductor devices and processes.

Another object of the present invention is to provide such a process for forming capacitors which are capable of uniform reproduction without being dependent on restrictive process controls.

A further object of the present invention is to provide such a process for forming capacitors for semiconductor memory cells.

Another object of the present invention is to provide new and improved capacitor structures utilizing the above-described process.

Yet another object of the present invention is to provide new and improved semiconductor memory cells incorporating the above-described capacitor structure.

Accordingly, a capacitor is provided having a substrate and a first capacitor plate including a lattice mismatched crystalline material is formed over and supported by a surface of the substrate. A layer of insulating material is formed over and supported by the first capacitor plate. A second capacitor plate including a layer of conductive material is formed over and supported by the layer of insulating material.

BRIEF DESCRIPTION OF THE DRAWINGS

These and other objects, features, and advantages of the present invention will become apparent upon consideration of the detailed description of the invention when read in conjunction with the drawing Figures, in which.

DETAILED DESCRIPTION OF THE INVENTION

Figure 1:
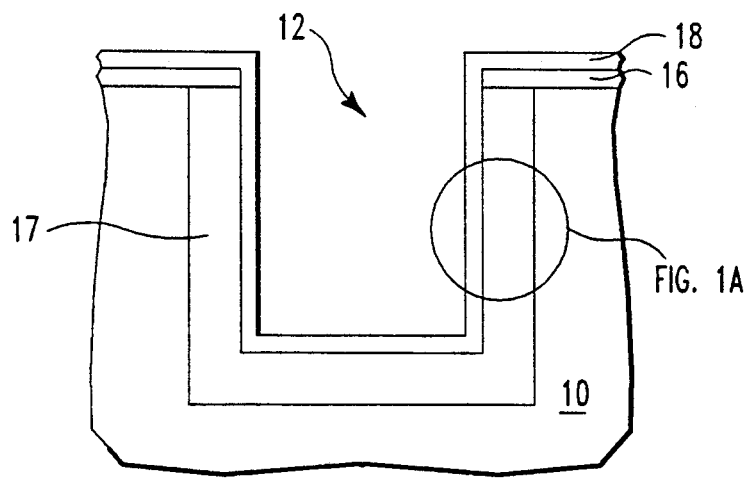
FIGS. 1-3 represent consecutive, cross-sectional views of a trench capacitor being constructed in accordance with the present invention, with FIG. 1A showing an enlarged portion of FIG. 1 and FIG. 3A showing an enlarged portion of FIG. 3.

Referring now to the drawings, FIG. 1 shows a semiconductor substrate 10 including a generally rectangular (in cross-section) trench 12 in a major surface thereof. Substrate 10 preferably comprises p-doped silicon, for example having a crystal orientation of <100> and a resistivity of approximately 0.01 $\Omega$/square. Substrate 10 is coated with a layer 16 of a dielectric material, e.g. a suitable oxide or nitride or a composite of oxide, nitride, and oxide layers on its top or plateau surface. Trench 12 is formed by a conventional process, for example by masking and anisotropically etching with an appropriate etchant using the layer 16 as a mask.

Figure 1A:
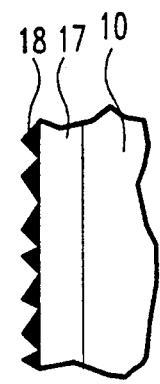

In accordance with the present invention, an n+ diffusion layer 17 is formed to line the sidewalls and base of trench 12, thus forming part of a ground plate when the capacitor of the present invention is finally formed. The layer 17 may be formed by conventional means. For example, the trench 12 may be filled with an n+ doped glass (not shown) and annealed to drive the dopants in the glass into the trench sidewalls and base. The residual doped glass is then removed by either a wet or dry etch process. A layer 18 of germanium is deposited heteroepitaxially on the surface of layer 17 to provide the roughened upper surface 18 visible in the enlarged view of FIG. 1A. Layer 18 is formed to a thickness of preferably less than about 350 Å, and can be formed by CVD at a temperature greater than 400° centigrade, a pressure in the ultrahigh vacuum range 1-50 mTorr, and using GeH$_4$ as a source gas in helium at about 30 sccm.

While this embodiment of the present invention has been illustrated by the deposition of Ge layer 18 over the diffusion layer 17, it is more generally described by the growth of any lattice-mismatched crystalline material under conditions so as to form "islands," or a highly roughened surface. The term "lattice-mismatched crystalline material" describes any crystalline material which is lattice-mismatched with respect to its underlying layer. In the preferred embodiment of the present invention this underling layer is substrate 10, comprising p-doped silicon. When such deposition is performed using germanium over silicon, the islanding effect is generally recognized to be the result of the Stranski-Krastanow Mechanism.

For a description of the growth of germanium over silicon, see Varhue, W. J., et al., "Surface Morphology of Epitaxial Ge on Si Grown by Plasma Enhanced Chemical Vapor Deposition," Proceedings of the First Topical Symposium of Silicon Based Heterostructures, Toronto, Oct. 8-10, 1990, pgs. 26-28, which discusses the heteroepitaxial growth of Ge on Si using plasma enhanced chemical vapor deposition. Varhue shows that by enhancing the mobility of the Ge atoms, which can be accomplished by increasing the power and/or the deposition temperature, three-dimensional growth, and highly roughened surfaces, can be obtained. Varhue is representative of other art in this field describing similar results. In the alternative, the layer 18 could be formed by molecular beam epitaxy.

In the present invention, other lattice-mismatched crystalline materials, such as gallium arsenide (GaAs) or metal silicides, can be substituted for the germanium of layer 18.

Figure 2:
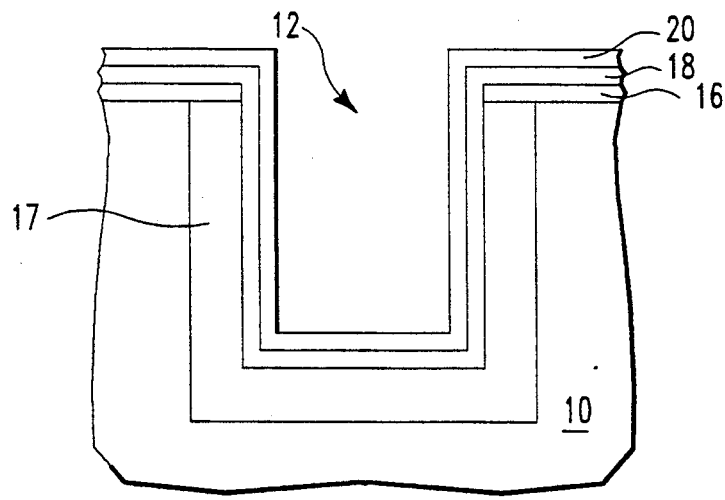

Referring now to FIG. 2, a layer 20 of a conductive material, preferably in situ doped polysilicon, is deposited conformally over the structure and within trench 12 to a thickness of 500 Å±100Å. Layer 20 can be formed, for example conventional CVD process. It has been determined that, as long as layer 20 is kept relatively thin (i.e. less than about 800Å in thickness), the roughness of the upper surface of layer 18 is replicated into the overlying conductive layer.

Figure 3:
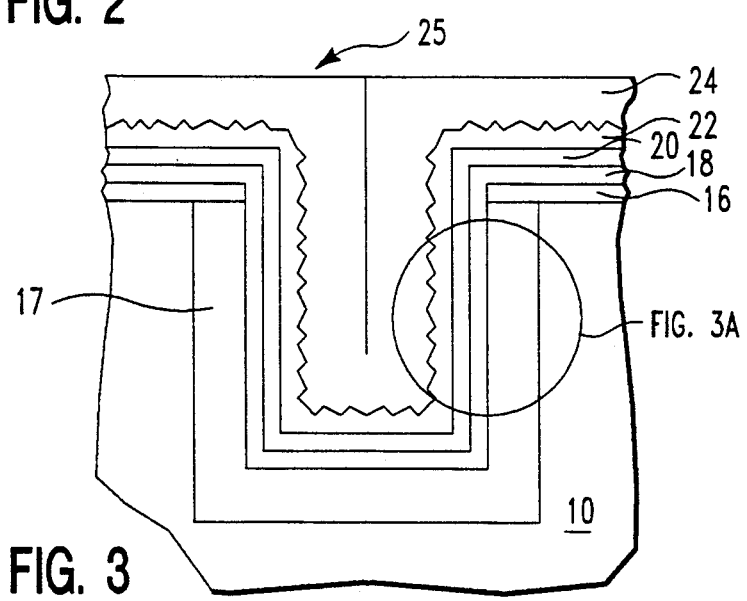

With reference now to FIG. 3, a layer 22 of insulating material, preferably silicon dioxide ($SiO_2$), is formed conformally over the structure to a thickness of about 100Å. Layer 22 can be formed, for example, by a conventional process of thermal oxidation or high pressure oxidation. Alternatively, layer 22 can be a composite layer formed from a layer of oxide and a layer of a nitride or formed from layers of an oxide, a nitride, and an oxide. Layer 22 is kept suitably thin so as to replicate the roughness originating on the upper surface of layer 18, but is of sufficient thickness to function reliably as an insulator in the subsequently formed capacitor. For purposes of illustrating the present invention, the roughened surface originating as the upper surface of layer 18 (FIG. 1A) is again shown diagrammatically reflected onto the upper surface of layer 22.

Figure 3A:
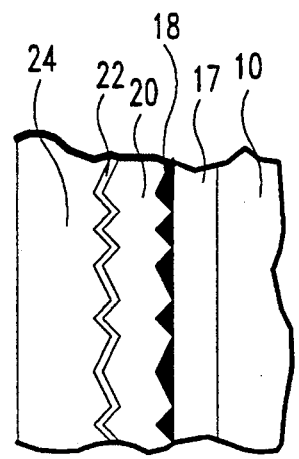

Still with reference to FIG. 3, a layer 24 of conductive material, preferably in situ doped polysilicon, is deposited conformally over the structure to a thickness of about 3,000 Å. Layer 24 can be formed, for example, by a conventional process of CVD. As shown in FIG. 3, layer 24 substantially fills aperture 12, forming conformally over the roughened upper surface of of layer 22. An enlarged view of the structure, including the textured surfaces originating with layer 18 and extending into the upper surface of layer 22, is shown in FIG. 3A.

There is thus formed a capacitor 25 having a first, ground, conductive plate of diffusion layer 17 germanium layer 18 and polysilicon layer 20, an insulator layer 22, and a second, node, conductive plate of layer 24. It will be understood that, while this capacitor has been shown formed in trench 12, it can alternatively be formed on a flat, or a raised mesa surface, or just about any surface configuration on which the necessary layers/materials can be deposited.

It has been determined that, in a normal semiconductor manufacturing environment, the capacitance of capacitor 25 formed in accordance with the present invention is highly controllable and reproducible. For example, through the use of a multi-chamber or so-called "cluster" tool, layers 18 and 20 may be deposited without removing the capacitor 25 from a vacuum environment. As mentioned above, the processes taught herein permit the capacitor to be formed on sidewalls such as those found in trenches and on raised mesas. Further, the inclusion of germanium has the benefit of improving the electrical contact properties of the silicon, germanium, and polysilicon layers 17, 18, and 20 respectively.

Figure 4:
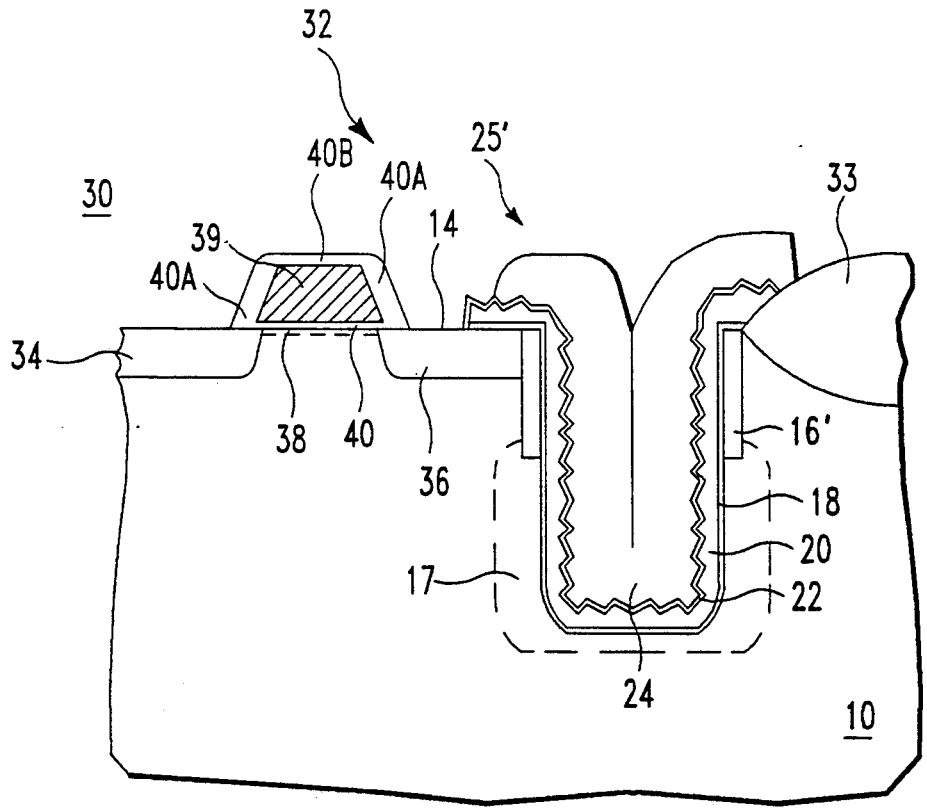
FIG. 4 is a cross-sectional view of an FET DRAM memory cell including a trench capacitor constructed in accordance with the process described above.

While the present invention has so far been illustrated as the formation of a capacitor, several examples will now be given of the application of the present invention to the formation of DRAM memory cells. Referring now to FIG. 4, a dynamic random access memory (DRAM) cell 30 is shown including a field effect transistor (FET) 32 connected to capacitor 25' for using the capacitor as a charge storage device. Capacitor 25' is similar to that shown in FIG. 3, with the exception that oxide layer 16' is formed only as a collar around the top portion of trench 12, and does not extend onto the horizontal surface 14 of substrate 10. The oxide collar 16' serves to electrically isolate nodes 36 and 17 in a known fashion. The oxide collar 16' may be formed by partially etching the trench 12 and growing an oxide on the sidewalls to a thickness of approximately 500 Å. The trench 12 is then further etched to remove oxide from the bottom portion of the trench 12. The ground conductive plate 17, 18, and 20 is formed in an identical fashion as is described in connection with the embodiment of the present invention shown in FIGS. 1-3. A thick layer of recessed oxide 33 generally surrounds DRAM cell 30, electrically isolating the cell from other semiconductor devices (not shown) on substrate 10.

FET 32 includes n+ type drain and source regions 34, 36, respectively, adjoining surface 14 of substrate 10, and spaced apart by a channel region 38. A gate electrode 39, preferably of polysilicon covered by a dielectric 40B, spans drain and source regions 34, 36 over channel 38, and is insulated from the channel by a thin layer of gate oxide 40. Thicker oxide regions 40A, form spacers to cover the sides of gate 38.

Germanium layer 18 of capacitor 25' extends over and into electrical contact with source region 36 of FET 32.

It will be understood that there are many different, known processes and methods for forming FET 32, the structure of which is well known in the art. The exact process used to form FET 32 is not relevant to the present invention, with the exception that the process selected be compatible with the formation of capacitor 25'. As an example, the following process steps can be used to form DRAM cell 30:

1) relevant areas are masked, and recessed oxide isolation 33 formed in a conventional manner;
2) capacitor 25' is formed in the manner described with respect to FIGS. 1-3 above, layer 18 extending into contact with drain region 36;
3) drain and source regions 34, 36 are formed and generally masked;
4) relevant areas are again masked, and FET 32 is completed.

Figure 5:
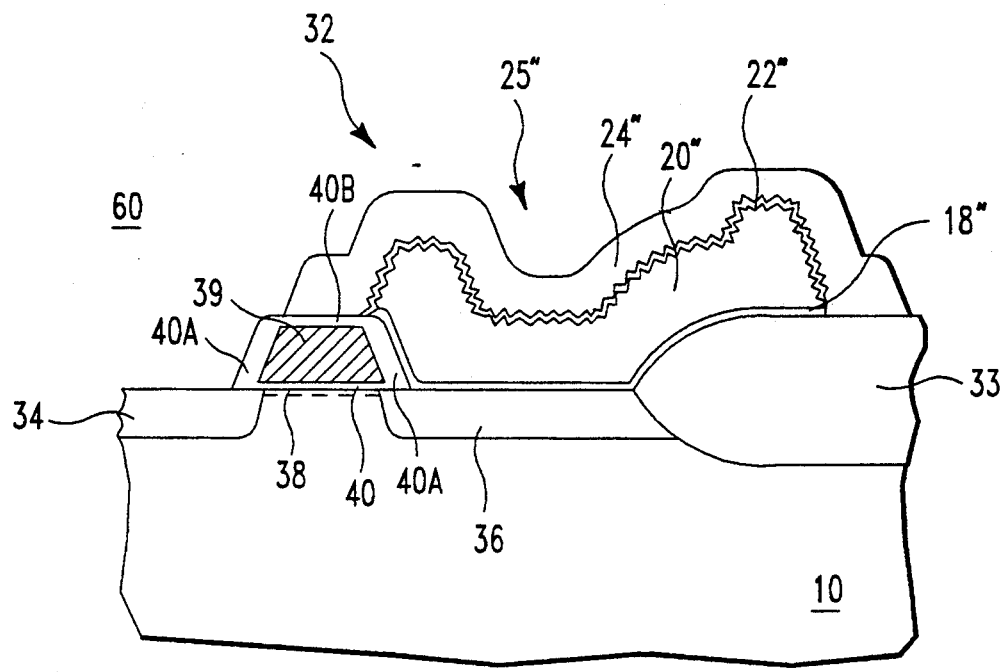
FIG. 5 is a cross-sectional view of an FET DRAM memory cell including a mesa capacitor constructed in accordance with the process described above.

Referring now to FIG. 5, a DRAM cell 60 is shown, including an FET 32 and a capacitor 25" substantially identical to the like-numbered structures earlier shown and described. DRAM cell 60 differs from cell 30 (FIG. 4) only in that capacitor 25" is disposed partially over the FET 32 and partially over adjoining field isolation region 33 (in contrast to in trench 12 as earlier described in FIGS. 1-3).

Many methods of forming FET 32 and capacitor 25" will be apparent to those skilled in the art, and the exact process steps are not relevant to the present invention. As an example, the following process steps can be used to form DRAM cell 60:

1) oxide isolation 33 is formed in a conventional manner, and the structure appropriately masked;
2) FET 32 is formed in a conventional manner, then appropriately masked;
3) layers 18", 20", and 22" of capacitor 25" are formed and defined (i.e. by etching); and
4) polysilicon layer 24" is deposited conformally over the structure, concurrently forming the second plate of capacitor 25" and establishing a ground contact.

There has thus been provided a new and improved capacitor structure having roughened surfaces to significantly increase capacitance without increasing cell size (footprint). The structure uses a heteroepitaxially deposited, lattice-mismatched crystalline material to provide the roughened surface in a process completely compatible with the formation of semiconductor devices. A process is described for forming the capacitor in a trench, or on any suitable surface configuration, including horizontal and mesa-type surfaces.

The above-described capacitor structure, and method of making same, is further provided in two DRAM cells: one cell including a trench capacitor, and the other including a stacked, generally horizontal capacitor. Processes are provided for manufacturing the cells. Such DRAM cells exhibit the benefits and improvements readily apparent from providing increased charge storage capability in the same or a smaller area.

The present invention has application in the formation of very large scale integrated (VLSI) circuits, and particularly in the formation of high density memory cells and DRAM cells.

While the invention has been shown and described with respect to preferred embodiments, it is not thus limited. Numerous changes, modifications, and improvements falling within the scope and spirit of the invention will occur to those skilled in the art.

What is claimed is:

1. A capacitor comprising:
   a substrate of a first material;
   a first capacitor plate including a roughened layer of a crystalline material supported by a surface of said substrate, said crystalline material being lattice mismatched with respect to said first material and selected from the group including germanium, gallium arsenide and metal silicides; and said first capacitor plate further including a doped diffusion layer supporting said crystalline material and a second layer of conductive material supported by said crystalline material;
   a layer of insulating material supported by said first capacitor plate; and
   a second capacitor plate including a first layer of conductive material supported by said layer of insulating material.

2. The capacitor of claim 1 wherein said first material comprises silicon or silicon dioxide.

3. The capacitor of claim 1 wherein:
   said crystalline material comprises germanium, having a thickness of less than about 300 angstroms; and said layer of insulating material and said second layer of conductive material are sufficiently thin to replicate the roughness of said roughened layer of second crystalline material.

4. The capacitor of claims 3 wherein said second layer of conductive material comprises a doped polysilicon layer having a thickness less than 600 angstroms.

5. The capacitor of claim 4 wherein said layer of insulating material is selected from the group comprising an oxide, a composite of oxide and nitride layers, and a composite of oxide, nitride, and oxide layers having a thickness of less than about 100 angstroms.

6. The capacitor of claim 1 and further including a semiconductor device connected to said capacitor for selectively storing and removing an electrical charge from said capacitor.

7. The capacitor of claim 1 wherein said surface of said substrate comprises a trench surface recessed within said substrate.

8. The capacitor of claim 7 wherein said trench includes sidewalls and a base and wherein at least a portion of said trench sidewalls are coated with a dielectric material and said first capacitor plate covers said dielectric material.

9. The capacitor of claim 1 wherein said surface of said substrate comprises a plateau surface.

* * * * *